US010209278B2

(12) United States Patent
Kufner et al.

(10) Patent No.: US 10,209,278 B2
(45) Date of Patent: Feb. 19, 2019

(54) SENSOR UNIT

(71) Applicant: LEONI KABEL HOLDING GMBH, Nuremberg (DE)

(72) Inventors: Stefan Kufner, Sonnefeld (DE); Maria Kufner, Sonnefeld (DE); Angel Radev, Strassbourg (FR); Benjamin Ross, Dummersheim (DE); Wolfgang Foss, Kronau (DE)

(73) Assignee: LEONI Kabel Holding GmbH, Nuremberg (DE)

( * ) Notice: Subject to any disclaimer, the term of this patent is extended or adjusted under 35 U.S.C. 154(b) by 352 days.

(21) Appl. No.: 15/049,346

(22) Filed: Feb. 22, 2016

(65) Prior Publication Data

US 2016/0169942 A1 Jun. 16, 2016

Related U.S. Application Data

(63) Continuation of application No. PCT/EP2014/067599, filed on Aug. 18, 2014.

(30) Foreign Application Priority Data

Aug. 22, 2013 (DE) ........................ 10 2013 216 722

(51) Int. Cl.
*G01R 33/26* (2006.01)
*G01R 15/24* (2006.01)

(52) U.S. Cl.
CPC ........... *G01R 15/24* (2013.01); *G01R 15/242* (2013.01); *G01R 15/246* (2013.01)

(58) Field of Classification Search
CPC .... G01R 33/26; G01R 31/311; G01R 33/032; G01R 31/2656; G01R 31/2891;
(Continued)

(56) References Cited

U.S. PATENT DOCUMENTS 5,053,617 A * 10/1991 Kakizaki ................ G01R 15/24 250/227.21
5,174,876 A * 12/1992 Buchal ................. G02B 6/1347 427/162

(Continued)

FOREIGN PATENT DOCUMENTS

DE 10140482 A1 * 3/2003 ............. G01R 15/24
EP 0477415 A1 4/1992
WO 2013001268 A2 1/2013

OTHER PUBLICATIONS

Raj Kumar N. et al: "Fiber Sensor for the Simultaneous Measurement of Current and Voltage in a High-Voltage System". Applied Optics, Optical Society of America, Washington, DC; US, vol. 32. No. 7, Mar. 1, 1993 (Mar. 1, 1993), pp. 1225-1228, XP000345965, ISSN: 0003-6935, DOI: 10.1364/A0.32.001225.

*Primary Examiner* — Jermele M Hollington
*Assistant Examiner* — Taqi Nasir
(74) *Attorney, Agent, or Firm* — Laurence A. Greenberg; Werner H. Sterner; Ralph E. Locher

(57) ABSTRACT

A sensor unit has a sensor element which has a substrate and a plurality of optical components, which are integrated into the substrate, and form a plurality of integrated optical sensors. The optical sensors are an optical current sensor based on the Faraday effect, an optical voltage sensor based on the Pockels effect, an optical strain sensor and/or a wavelength sensor. Response signals from the individual sensors are evaluated in an evaluation unit, wherein the response signals from the expansion sensor and/or from the wavelength sensor are preferably used for evaluating the response signals from the other sensors.

21 Claims, 2 Drawing Sheets

(58) Field of Classification Search

CPC .. G01R 1/071; G01R 31/2887; G01R 31/308; G01R 33/0322; G01R 15/246; G01R 31/2601; G01R 1/06794; G01R 29/24

USPC ... 324/750.23, 242, 243, 529–530, 177–179, 324/304, 305, 244.1, 754.23, 76.36, 753, 324/506, 542, 556, 97, 752

See application file for complete search history.

(56) References Cited

U.S. PATENT DOCUMENTS

| | | | | |
|---|---|---|---|---|
| 5,304,920 | A | 4/1994 | Stierlin | |
| 5,545,080 | A | 8/1996 | Clowers et al. | |
| 5,731,579 | A * | 3/1998 | Woods | G01R 1/071 250/227.17 |
| 7,064,315 | B2 | 6/2006 | Kraemmer | |
| 2001/0019103 | A1 * | 9/2001 | Sugai | G01L 1/246 250/227.18 |
| 2003/0072005 | A1 * | 4/2003 | Tsao | G01K 11/3206 356/479 |
| 2004/0024937 | A1 * | 2/2004 | Duncan | H02M 7/003 710/100 |
| 2006/0285813 | A1 * | 12/2006 | Ferguson | G01B 11/16 385/138 |
| 2007/0273400 | A1 * | 11/2007 | Kamieniecki | G01R 31/2648 324/754.23 |
| 2010/0067021 | A1 * | 3/2010 | Danzebrink | G01Q 20/02 356/493 |
| 2011/0267087 | A1 * | 11/2011 | Huang | G01R 31/2635 324/754.23 |
| 2014/0211202 | A1 | 7/2014 | Niewczas et al. | |
| 2015/0346524 | A1 * | 12/2015 | Afshari | G02F 1/1309 324/754.23 |
| 2016/0116531 | A1 * | 4/2016 | Ranganathan | G01R 31/311 324/754.23 |

* cited by examiner

SENSOR UNIT

CROSS-REFERENCE TO RELATED APPLICATION

This application is a continuation, under 35 U.S.C. § 120, of copending international application No. PCT/EP2014/067599, filed Aug. 18, 2014, which designated the United States; this application also claims the priority, under 35 U.S.C. § 119, of German patent application No. DE 10 2013 216 722.9, filed Aug. 22, 2013; the prior applications are herewith incorporated by reference in their entirety.

BACKGROUND OF THE INVENTION

Field of the Invention

The invention relates to a sensor unit with a sensor element having a substrate and with at least one optical component, integrated in the substrate, specifically having at least one integrated measurement waveguide for forming an integrated optical sensor, which is configured for measuring an electric variable.

European patent EP 0 477 415 B1 discloses a sensor unit which has an optical sensor element for measuring the electric current using the Faraday effect. To this end, an optical waveguide formed in a substrate is guided circumferentially around a central cutout. The conductor through which the current to be measured flows is guided through the central cutout.

The use of optical sensors for monitoring for example electrical and other devices is known in principle. What is used here in principle is that a variable to be measured, such as electric current, electric voltage or ambient temperature, influences the light propagation within a specially configured sensor element and generates a characteristic response signal.

In addition to the already mentioned current sensor, which is based on the Faraday effect, a voltage sensor based on the so-called Pockels effect is also known. The influence of a temperature can be ascertained using a Bragg grating.

United States patent application publication US 2004/0024937 A1 describes an electrical power converter which is arranged, for example, in a switch cabinet and which is monitored by a plurality of optical sensors that are positioned correspondingly at suitable locations.

U.S. Pat. No. 5,545,080 likewise discloses a sensor arrangement having a plurality of optical sensors. Here, specially suitable crystals having a suitable thickness, which are connected by fiber optics, are used in each case for the various sensor elements.

German published patent application DE 101 40 482 A1 furthermore discloses an optical sensor device, in which the actual optical sensor element, for example a current sensor, is assigned a compensation element, in particular in the form of a Bragg grating. An input measurement signal is influenced by the compensation element as a function of an exterior disturbance variable, such as for example temperature or vibration. The measurement signal thus influenced subsequently runs through the actual sensor, such that the disturbance variable which acts from outside is compensated for for the effect that is actually to be measured.

The known optical sensor arrangements frequently have a complicated and complex construction.

SUMMARY OF THE INVENTION

It is accordingly an object of the invention to provide a sensor unit which overcomes the above-mentioned and other disadvantages of the heretofore-known devices and methods of this general type and which provides for an improved sensor unit.

With the foregoing and other objects in view there is provided, in accordance with the invention, a sensor unit, comprising:

a sensor element having a substrate and a plurality of optical components integrated on said substrate;

said plurality of optical components including at least one integrated measurement waveguide forming an integrated optical sensor for measuring an electric variable and at least one further optical component integrated on said substrate and forming a further integrated optical sensor;

said optical sensors being selected from the group consisting of:

a) an optical current sensor based on the Faraday effect for measuring an electric current in a current-carrying conductor;

b) an optical voltage sensor based on the Pockels effect for measuring an electric voltage;

c) an optical expansion sensor for measuring an expansion; and d) a wavelength sensor for measuring a change in an optical wavelength.

Here, the sensor unit comprises a sensor element having a substrate, into which at least one optical component for forming a first optical sensor is integrated, which optical sensor is configured for measuring an electric variable, in particular electric current. This at least one integrated optical component is at least one integrated measurement waveguide, which serves for forming the integrated optical sensor, which is thus configured for measuring an electric variable. Measurement waveguide in this context is understood to mean in particular that the in particular electric variable to be measured influences the propagation of an optical sensor signal, which is input into the waveguide, in the region of the measurement waveguide.

Integrated optical component in the present context is understood to mean that the component is embedded in the substrate. Integrated here also applies if a non-fiber-optic component is coupled directly, i.e. without interconnection of an optical fiber, to the substrate by way of a suitable bonding method.

Integrated means in a preferred variant that the components, in particular measurement waveguides, are formed by modifying the substrate itself, expediently by an ion diffusion process, which is known per se.

In addition to this integrated measurement waveguide, at least one and preferably a plurality of further optical components is integrated on the substrate for forming a first sensor, which optical components are configured for forming at least one further integrated optical sensor. These further optical components are expediently other waveguides, in particular measurement waveguides, which serve for measuring another variable, generally a physical variable.

Integrated optical sensor is generally understood to mean that at least some components necessary for the functionality of the sensor are integrated directly in the substrate. All components necessary for the functioning of the sensor are expediently integrated in the substrate. Overall, preferably all components necessary for the individual configured optical sensors are component parts of the one common sensor element.

The integrated optical sensors are here selected from an optical current sensor on the basis of the Faraday effect for measuring an electric current in a current-carrying conductor. Such a measurement principle is disclosed, for example, in European patent EP 0 477 415 B1, which was mentioned in the introductory text above and which is incorporated by reference. Alternatively or in combination, an optical voltage sensor, an optical expansion sensor and a wavelength sensor are furthermore integrated. The optical voltage sensor is here configured on the basis of the Pockles effect for measuring an electric voltage, the optical expansion sensor is configured for measuring an expansion caused in particular by heat, and the wavelength sensor is configured for measuring an optical wavelength of the input sensor signal.

The optical voltage measurement on the basis of the Pockels effect is likewise known in principle and is based on the use of special birefringent crystals, in which the birefringence changes due to the existence of an electric field. This change is here typically linearly proportional to the electric field.

The optical expansion sensor is based on the effect of an optical path length change caused by the expansion of the substrate, which is detected in suitable fashion. Owing to the direct integration of the waveguide (measurement waveguide) in the substrate, an expansion caused by heat is therefore immediately detected.

The wavelength sensor is based in principle on the integration of a wavelength-sensitive component in the substrate, for example a grating, the grating period of which is matched to a defined wavelength of the input sensor signal, so that in the case of a variation of the wavelength, this can be identified. It is here particularly possible using the wavelength sensor to monitor the input sensor signal with respect to drift over the course of operation.

For each sensor, a sensor signal is coupled into the substrate in suitable fashion, which sensor signal is changed owing to the influence of the variable to be measured by the respectively integrated optical component of the respective sensor into the variable to be measured, and an optical response signal generated hereby is evaluated with the aid of an evaluation unit. The variable to be measured is electric current, electric voltage, temperature, or the wavelength of the measurement signal. The response signal is generally coupled out of the sensor element and transmitted to the evaluation unit. The evaluation unit also expediently provides the input sensor signal at the same time. Sensor signal and response signal are preferably transmitted between the sensor element and the evaluation unit by fiber optics. A corresponding optical transmission fiber is therefore coupled to the carrier for coupling the sensor signal and the response signal in and/or out. The coupling sites into or out of the sensor element for the sensor signal and the response signal are here arranged according to a first embodiment variant at different positions, and according to a second embodiment variant at the identical same position, such that in the second variant, only one fiber is provided both for inputting the sensor signal and for returning the response signal.

Due to the multiple integration of different optical sensors which are configured for measuring different, in particular physical variables, overall a highly integrated sensor arrangement is provided on only one carrier substrate, which sensor arrangement is configured to be very compact and space saving.

Expediently, response signals that are inherent to the sensor unit and quasi characterize properties or changes of the unit and thus of the measurement construction are used for the evaluation of the response signals of the optical sensors for measuring the electric variables. Since the exact knowledge of the used wavelength and of the optical path length and thus the phase relationships is of critical importance for a reliable measurement, this integrated optical construction provides a sensor unit which is particularly suitable for a reliable and effective and accurate measurement, for example of current and/or voltage values.

In a preferred embodiment, an evaluation unit is thus provided which ascertains the optical response signals of the current sensor and/or voltage sensor in dependence on the optical response signals of the expansion sensor and/or the wavelength sensor.

With respect to a further integration and compact configuration, preferably a measurement waveguide is furthermore used for a plurality of different sensors at the same time. Therefore, different measurement variables are ascertained via a common measurement waveguide. As a result, the manufacturing complexity is reduced. Furthermore, provision is expediently made for an integrated optical waveguide to be split across a plurality of measurement waveguides using an integrated splitter, in particular an integrated Y splitter. As a result, there is therefore a possibility for using only one input sensor signal in parallel for a plurality of integrated sensors.

The optical expansion sensor expediently forms a Michelson interferometer and to this end has two measurement waveguides integrated in the substrate, which are referred to as waveguide arms. The two waveguide arms here have different optical path lengths for forming the Michelson interferometer. A time-of-flight difference of the split input optical sensor signal is evaluated.

For forming the various optical wavelengths, the waveguide arms are here expediently curved and in particular have different radii of curvature. Owing to the curved configuration, the basic geometry of the configuration of the current sensor is adopted, in which in principle a measurement waveguide is configured to be (partially) circular.

In a preferred configuration, one of the waveguide arms is here formed at the same time furthermore by a measurement waveguide for one of the other sensors, in particular for the current sensor. The waveguide arm therefore has a double function for capturing two different variables. What is particularly advantageous is if the evaluated response signal of the expansion sensor is used for the evaluation of the response signal of the current sensor. Since there is at least a partial identity of the measurement waveguide, the properties of said measurement waveguide therefore are incorporated directly into the evaluation of the response signal for the current sensor.

The wavelength sensor expediently has a Bragg grating and/or a resonator ring or a directional coupler for identifying changes in wavelength of the input sensor signal.

A plurality of the optical sensors is here preferably integrated on a common wafer. They therefore do not consist of various individual assembled substrate parts. In particular, they are integrated on a common wafer, for example a 6 inch wafer. The integration on a common wafer ensures that the substrate overall is as homogeneous as possible.

At least part, preferably at least a majority of, or all of the optical components of the sensors are here configured as components integrated in the wafer. What is meant here is that the optical components are configured by way of special preparation of the wafer on the latter.

A substrate used for the wafer is here preferably a glass, in particular a suitable special glass, as is disclosed for example in European patent application No. EP 0 477 415 A1. In particular, a special glass with the designation BGG 31, which is commercially available from the company Schott is used. The substrate typically has a thickness in the range of a few millimeters, for example 1 to 5 mm, preferably less than 3 mm and in particular 1.5 mm.

This glass expediently has no, or at most a slight, birefringence. This is particularly important for reliable functioning of the sensors used. To this end, a particularly controlled manufacturing of the substrate, in particular special glass, is necessary, specifically such that, if possible, no mechanical stresses are introduced into the substrate during the manufacturing process.

In a preferred configuration, the substrate is quasi post-treated in a targeted fashion for forming optical components having birefringence in partial regions of said substrate. Therefore, a birefringent function is integrated into the substrate in partial regions. In particular, this serves for forming lambda quarter components.

The integrated optical components are preferably incorporated in the substrate using an ion exchange process. This ion exchange process is very gentle compared to other structuring processes and does not, for example, result in stresses in the substrate which could lead to undesired birefringence.

The integrated optical components can here be present in different embodiments, for example as optical waveguides both in straight or curved form, as polarization changing optical elements, such as the already mentioned lambda quarter element. The integrated optical components can furthermore be configured as coupling sites for coupling light in and out, as mirrored surface, as end faces and/or as optical gratings. All these components are produced in particular by way of a targeted ion diffusion process and/or by further lithographic processes.

Such a supplementary lithographic process is, for example, the etching technique, in which the desired structures are introduced by way of an etching method—either wet chemically or dry, for example by reactive ion etching. In addition to etching, the configured structure is preferably also treated with a suitable coating method.

By way of example, a trench formed by etching is produced directly over the incorporated waveguide to produce the lambda quarter element, wherein the trench has a defined length and depth. This trench is preferably also provided with an optical coating to produce the desired lambda quarter effect.

During the configuration of the optical grating, the latter is preferably likewise produced by way of etching (wet chemically or dry), possibly again using an optical coating. Such etching methods can be used to accurately control the grating period.

As an alternative to this integrated configuration of these optical components, they can also be realized as additional external components which are coupled preferably directly to the substrate. By way of example, the lambda quarter element can be realized as a fiber piece or a crystal plate which can be affixed directly similar to a ferrule to the waveguide.

The functioning and the construction of the optical current sensor and of the optical voltage sensor are known in principle. The optical voltage sensor expediently has the following sequence and preferably consists of this sequence: a coupling site for a polarization-maintaining fiber (PM fiber), an optical lambda quarter element, in particular formed by a specially prepared, integrated waveguide section, and a measurement waveguide which is integrated in a birefringent substrate suitable for the Pockels effect. This measurement waveguide is preferably provided with reflective means on the end face.

Said birefringent substrate, in particular a suitable crystal, is here expediently coupled to the (basic) substrate by a further suitable coupling site. By way of example, the crystal is coupled by a front face to a planar side face of the substrate using a suitable bonding method, such that a common carrier with two different substrates is formed, specifically one birefringent and one non-birefringent substrate.

During the bonding method, that is to say during the coupling of the crystal to the substrate for example, the surface coupling sites on the substrate and on the crystal are typically polished and affixed to one another, for example by way of an adhesive film. The integrated waveguides are already previously formed in the substrate and in the crystal. Upon combining, an optical signal is then input into the waveguide. The two components are positioned relative to one another with the evaluation of the signal that is transmitted from one component to the other.

As an alternative to this integrated construction with the further substrate integrated into the carrier, a construction is provided in which the light is coupled into the birefringent crystal from the waveguide that is integrated in the substrate preferably via a lambda quarter element and an optical lens, in particular a so-called GRIN lens. Said crystal is again expediently made reflective on its end face and the reflected optical signal is coupled into the waveguide integrated in the substrate as a response signal on the return path by the lens and via the lambda quarter element. The signal is collimated using the optical lens and coupled into the crystal. The optical lens is preferably coupled directly to the substrate of the wafer by way of a bonding method, without interconnecting a fiber-optic component. Alternatively, a so-called free space construction is possible, in which the lens and the crystal are connected to the substrate via a fiber-optic component.

A lithium niobate crystal is used in particular for the birefringent substrate. Instead of the lithium niobate crystal, it is also possible to use other voltage birefringent crystals, in particular ADP (ammonium dihydrogen phosphate) or KDP (potassium dihydrogen phosphate). The voltage sensor is based on the known Pockels effect.

The current sensor generally uses the so-called Faraday effect in a manner known per se. The sensor here preferably has the following sequence, or consists thereof: a coupling site for a polarization-maintaining fiber, a preferably integrated optical lambda quarter element, a curved waveguide integrated in the substrate, and preferably an end face of the waveguide which is made reflective. In supplementation, the substrate has a central, preferably circularly round, cutout, through which the electric conductor which carries the current to be measured is guided. It suffices here if the curved waveguide surrounds the current conductor partially, for example in semicircular fashion, and the substrate correspondingly defines also only a semicircular ring. The substrate is generally formed as a circular ring segment. The external contour is for example adopted from the original wafer. Said contour can in principle also be rectangular.

The expansion sensor which is configured in particular as Michelson interferometer (also referred to as Michelson sensor, in short) serves in particular for determining the thermal expansion and comprises preferably a combination of two curved waveguides, which have different radii with respect to the wafer center point and thus expand to varying degrees along their lengths.

In a particularly expedient manner, the expansion or temperature sensor which is configured as a Michelson interferometer here uses a waveguide of a different sensor, in particular of the current sensor. This thus brings about a double use of one of the waveguides that are integrated on the substrate, which thus has a double function.

For configuring the Michelson sensor, an additional waveguide track is here preferably guided particularly concentrically with respect to the waveguide track of the current sensor and coupled to an additional fiber, in particular a single-mode fiber (SM fiber).

Integrated on the substrate is preferably at least one splitter, which connects the additional waveguide track to the waveguide track of the other sensor (current sensor), preferably subsequently to the lambda quarter element.

The lambda quarter element can be generally formed on the substrate as a defined piece of an optical fiber, as a defined small crystal plate (birefringent) and, in a preferred configuration, as an integrated optical waveguide with birefringent function.

The expansion sensor that is configured in particular as a Bragg sensor can be used for determining the thermal expansion and preferably comprises a coupling site for an in particular single-mode optical fiber and an optical waveguide integrated in the substrate, in which a surface grating having a defined grating period is introduced in particular by way of an ion diffusion process.

The surface grating is here configured such that it leads to a back reflection of a selected wavelength which depends on the grating period of the surface grating. With this measurement construction, the changes in the optical path section can be ascertained on the basis, for example, of thermally caused length changes. This measurement construction can be used in principle to capture wavelength changes. For capturing wavelength changes, for example for identifying a wavelength drift of the optical sensor signals used, preferably an additional wavelength sensor is used, for example as a resonator ring or a directional coupler.

The sensor unit is used in particular for measuring the electric variables such as current and/or voltage in a power installation, in particular a current distribution installation. The unit is preferably used in a medium voltage installation in which currents in the range of up to a few hundred amperes are switched and voltages in the range of a few kilovolts or a few 10 kilovolts are used. The sensor unit is used to measure such currents or voltages.

Other features which are considered as characteristic for the invention are set forth in the appended claims.

Although the invention is illustrated and described herein as embodied in sensor unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

In the figures, elements with identical or equivalent function are identified with identical reference signs throughout.

DETAILED DESCRIPTION OF THE INVENTION

Figure 1:
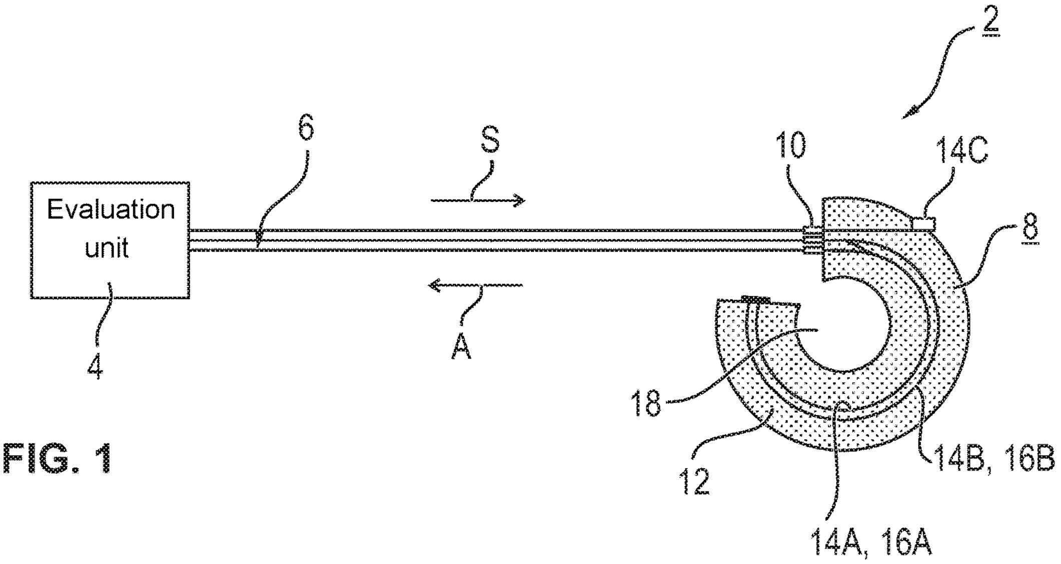
FIG. 1 a sensor unit having a carrier as a sensor-active element, which carrier is connected fiber optically to an evaluation unit.

Referring now to the figures of the drawing in detail and first, particularly, to FIG. 1 thereof, there is shown sensor unit 2 which comprises a common evaluation unit 4, which is connected to a sensor element 8 via a plurality of optical fibers 6, in the exemplary embodiment three optical fibers 6. Each optical fiber is here allocated a separate channel of the evaluation unit 4. The individual optical fibers 6 are connected to the sensor element 8 by way of coupling elements at coupling sites 10. In particular, they are coupled to the sensor unit by way of so-called ferrules. Ferrules are small tubes or tubelets typically made of metal, into which the optical fiber 6 is placed concentrically, in particular into which it is glued.

The sensor element 8 has a substrate 12 as a carrier and preferably consists entirely of this carrier substrate, at least a plurality of sensors 14A,B,C is integrated in the substrate 12. The sensor element 8 or the substrate 12 is in particular glass.

The various optical sensors 14A,B,C are integrated on the substrate 12. They serve for measuring various measurement variables. To this end as will be explained below with reference to FIGS. 3 to 5 in more detail a plurality of optical components is integrated in the substrate 12, specifically in particular a first measurement waveguide 16A, a second measurement waveguide 16B and a third measurement waveguide 16C.

During operation, an optical sensor signal S is coupled by the evaluation unit 4 for each channel into a respective measurement waveguide 16A,B,C by a respective optical fiber 6A, B, C. The sensor signals can be different or identical sensor signals. The evaluation unit here preferably has different light sources for the individual channels for generating the respective optical sensor signal. Alternatively, it is also possible for a light source for a plurality of channels together to be provided. A sensor signal used is typically a pulsed light signal, for example having a frequency in the MHz range. A laser diode is preferred as a light source which generates a sensor signal S having a wavelength in the IR range (from approximately 800 nm to 1700 nm), in particular in the range of approximately 830 nm.

The individual measurement waveguides 16A,B,C have different constructions with respect to one another and influence the input sensor signal S in different ways. In the exemplary embodiment, the sensor signals S are returned in each case and transmitted back to the evaluation unit 4 via the same optical path section as the response signal A. In the evaluation unit 4, the evaluation of the different response signals A of the individual sensors 14A,B,C is carried out. Each sensor 14A,B,C is therefore allocated a dedicated evaluation channel.

The substrate 12 is an in particular circular ring segment, which extends preferably at least approximately over 180° and, in the exemplary embodiment, extends for example over approximately 270° to 300°. The substrate 12 is therefore configured in the manner of a circular ring about a central cutout 18. The substrate 12 is configured from a wafer which has in particular a diameter of 6 inches.

According to the circular ring-shaped configuration, at least the first and second measurement waveguides 16A, 16B extend in the shape of a circular ring. They have a waveguide radius in the range of several 10 mm and for example of at most 70 mm. The maximum internal radius of the central cutout 18 is for example 50 to 60 mm. The two measurement waveguides 16A, 16B extend in particular concentrically with respect to a common circle center point. The optical path length in particular of the first and second measurement waveguides 16A, 16B is here a few 100 mm, and is for example up to approximately 450 to 500 mm.

Figure 2:
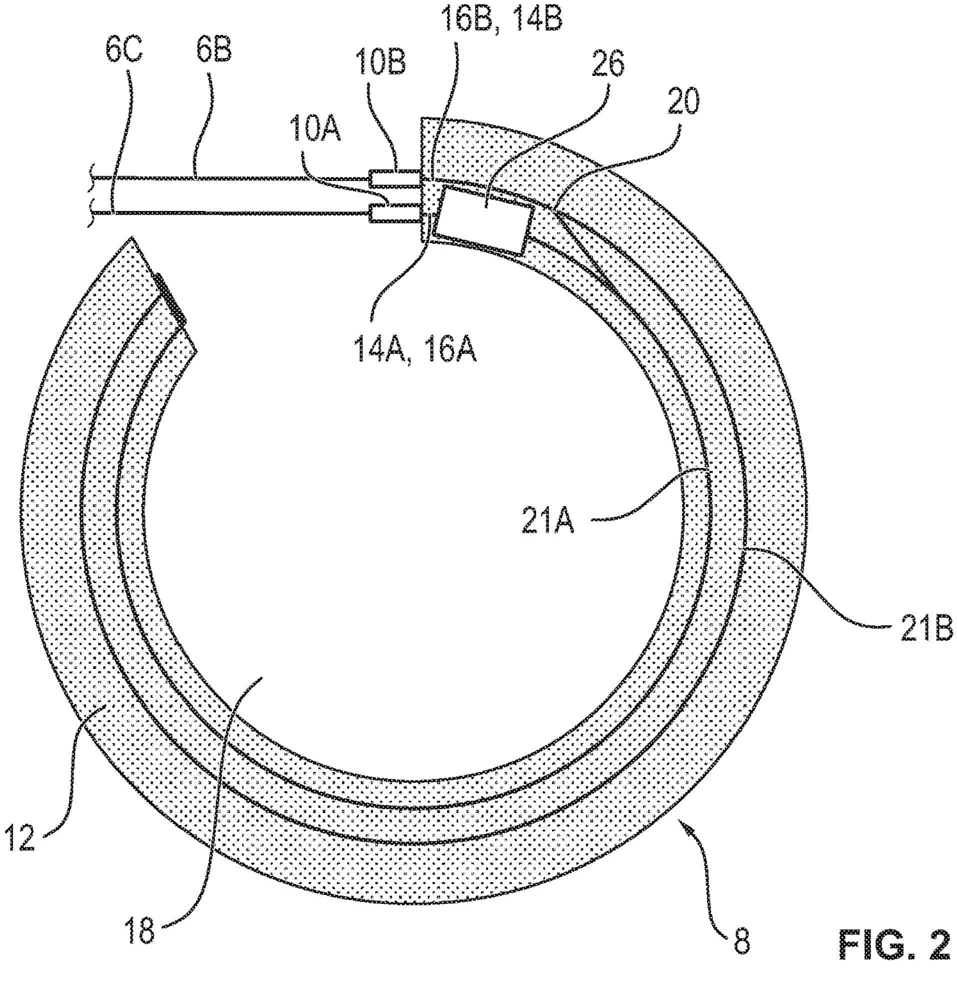
FIG. 2 a first exemplary embodiment of a sensor element according to the invention.

In the embodiment variant illustrated in FIG. 2, the sensor element 8 is configured with an integrated optical current sensor 14A and an integrated optical expansion sensor 16B. The expansion sensor serves for measuring in particular a thermal expansion of the sensor element 8 itself, and is configured in particular in the manner of a Michelson interferometer. To this end, the expansion sensor has two waveguide arms 21A, 21B, which are formed by the second measurement waveguide 16B and, in sections, by the first measurement waveguide 16A.

The first measurement waveguide 16A serves for configuring the current sensor 14A. The sensor signal S is coupled into the first measurement waveguide 16A via a first coupling site 10A and a different or the same sensor signal S is coupled into the second measurement waveguide 16B via a second coupling site 10B. The coupling sites are configured for example as so-called ferrules. The one sensor signal S is split via a splitter 20 that is configured as a Y splitter 20 and input from the second measurement waveguide 16B in parallel also into the first measurement waveguide 16A. As a result, the two waveguide arms 21A, 21B of the Michelson interferometer are formed. At the end of the two measurement waveguides 16A, 16B, a front-face end face 22 of the substrate 12 is suitably prepared for forming a mirror 24.

For forming the current sensor 14A, preferably a polarization-maintaining fiber (PM fiber) 6A is coupled as the optical fiber 6 to the substrate 12 to the circularly guided measurement waveguide 16A via the coupling site 10A that is configured as a ferrule. After the coupling site 16A, a lambda quarter element 26 is formed in the substrate 12A, in particular with the integration of a suitable birefringent waveguide section. Except for these special partial regions, which are configured to be birefringent by special treatment, specifically by ion diffusion, the substrate 12 is free of birefringence, which is desired and required for the envisaged sensor properties in particular for the current sensor 14A.

Using the lambda quarter element 26, the coupled-in sensor signal S, that is to say the light that is coupled in, is converted into circularly polarized light. The reflected and cast back light is subsequently again converted by the lambda quarter element 26 into linearly polarized light like the coupled-in sensor signal S.

During operation, a current-carrying conductor (not illustrated here further) is guided through the central cutout 18. The current measurement is based on the Faraday effect which is known per se, in which the light propagating in the first measurement waveguide 16A is influenced by the current-carrying conductor in a defined manner and is evaluated later by evaluation of the response signal A in the evaluation unit 4 to ascertain a current value.

In the embodiment variant according to FIG. 3, again the current sensor 14A is formed. Furthermore, the expansion sensor 16B with the Michelson interferometer having two waveguide arms 21A,B is also formed here. In this embodiment variant, however, the expansion sensor 16B does not share a measurement waveguide 16A with another sensor 14A. The sensor signals S are also coupled in at different positions of the substrate 12. To this end, in particular a notch 28 is provided in the substrate 12. At the end of the two waveguide arms 21A,B, a further notch 28 is formed at which again, for example by way of a coating of the end face 22, a mirror 24 is formed.

Figure 3:
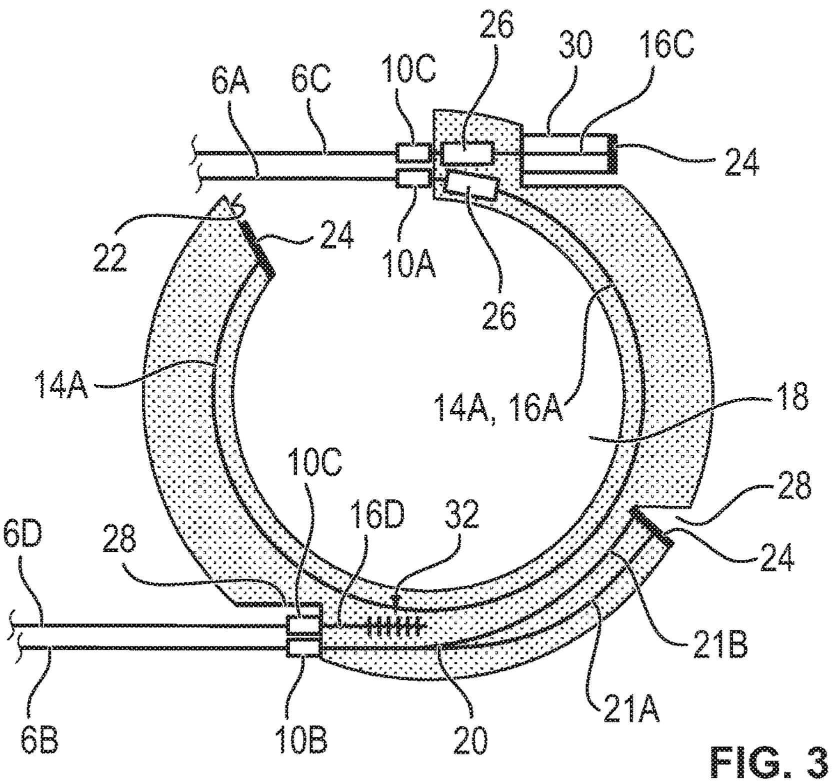
FIG. 3 a second exemplary embodiment of a sensor element.

In the exemplary embodiment of FIG. 3, a voltage sensor 14C is configured in supplementation. The latter comprises like the current sensor 14A a coupling site 10C, in which likewise a preferably polarization-maintaining fiber 6C is coupled using a ferrule. Downstream of the lambda quarter element 26, another integrated waveguide section follows, which is then guided as a third measurement waveguide 16C in a birefringent crystal 30 as a further substrate. At the front end side of the crystal 30, a mirror 24 is formed again, such that the input sensor signal S is cast back again after passing through the crystal 30 and leaves the sensor element 8 as a response signal.

Finally, in the embodiment variant of FIG. 3, a fourth optical sensor 14D is integrated, which is configured as a wavelength sensor and which is sensitive to the wavelength of the input sensor signal S. To this end, the wavelength sensor has a fourth measurement waveguide 16D and, in supplementation, a Bragg grating 32. Both components, at least the fourth measurement waveguide 16D, are introduced into the substrate 12 by way of an ion diffusion process, possibly in supplementation with further lithographic processes. For example, the Bragg grating 32 is configured by way of an etching process with subsequent coating. The sensor signal S is similar as in the case of the expansion sensor 14B coupled via a preferably single-mode fiber 6D and a ferrule as coupling site 6D. The sensor signal S is preferably the same sensor signal S as used for the current sensor 14A or the voltage sensor 14C. Wavelength drift of the input sensor signal can be detected via the wavelength sensor.

Figure 4:
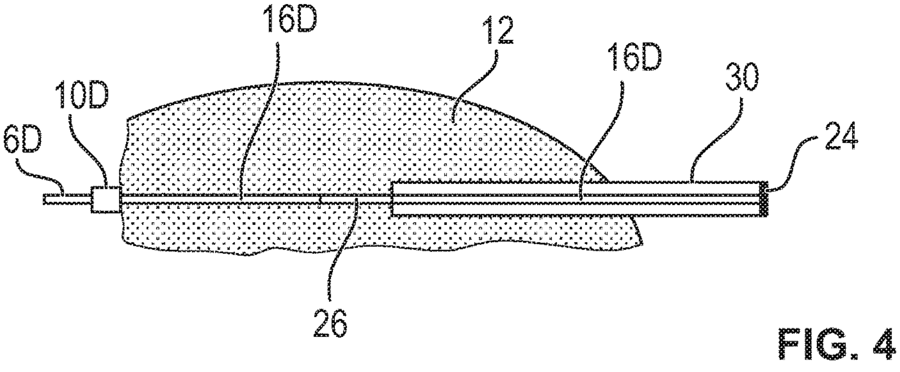
FIG. 4 a first embodiment variant of the optical components of a voltage sensor.

The construction of the voltage sensor 14C according to FIG. 3 is illustrated again with the essential optical components thereof in FIG. 4. It shows that the polarization-maintaining fiber 6C is coupled to the substrate 12 via the coupling site 10C and continues in the substrate 12 in an integrated waveguide section which is formed by ion diffusion. This is followed by the lambda quarter element 26, which in turn is coupled to the crystal 30 by a further coupling site, in which crystal the measurement waveguide 16C is then formed, preferably again by an ion diffusion process, as an integrated waveguide. The crystal 30 is here coupled to the substrate 12 by a bonding method which is known per se.

Figure 5:
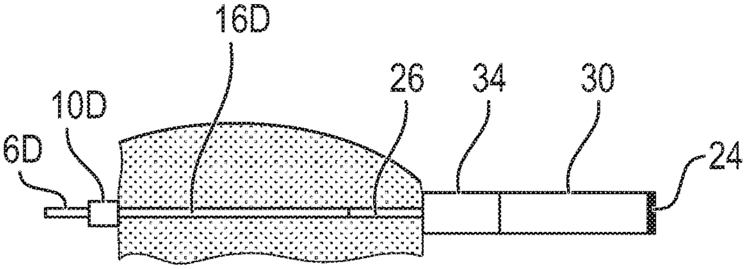
FIG. 5 a second embodiment variant of the optical components of a voltage sensor.

In contrast, according to FIG. 5, a so-called free space optical embodiment variant is illustrated, in which, in contrast to the embodiment variant according to FIG. 4, the lambda quarter element 26 is followed initially by an optical lens, in particular a so-called GRIN lens 34, by which the sensor signal S, that is to say the input light, is collimated and coupled into the crystal 30. To this end, a further coupling site is configured between the GRIN lens 34 and the crystal 30, in particular by way of a suitable bonding method. Finally, a mirror 24 is also formed in this case at the end of the crystal 30. The GRIN lens 32 is here according to a first variant likewise coupled directly to the substrate 12 by a bonding method. Alternatively, another optical fiber can be coupled between the substrate 12 and the GRIN lens 34, such that the crystal 30 can also be positioned away from the substrate 12.

What should be highlighted in the sensor element 8 is in particular the integration of a plurality of optical sensors 14A,B,C,D within the common sensor element 8, so that a plurality of different variables can be captured metrologically using a uniform unit. A further advantage is that inherent properties of the sensor element 8, that is for example an expansion, is detected directly by the expansion sensor 14C. Therefore the state of the sensor element 8 is directly detected and used in the evaluation unit 4 for evaluating the response signals A of the other optical sensors, in particular the current sensor 14A and the voltage sensor 14C.

In a similar way, the response signal A of the wavelength sensor 16D is also used for evaluating the other response signals A. In particular, it is established whether the light source used for generating the sensor signal S has a sufficient constancy or whether possibly the wavelength varies, i.e. a wavelength drift occurs. If such a drift is detected, this is incorporated in the evaluation of the other response signals A.

The wavelength sensor 16D can also be used in parallel owing to the use of the Bragg grating 32 as an expansion sensor for determining the thermal expansion. For the determination of the expansion, both such a grating 32 and the described Michelson interferometer principle can be used. The grating 32 is introduced into the surface of the substrate 12 with a suitable grating period by way of an ion diffusion process and/or by a further lithographic process. The grating 32 is here configured such that it causes back reflection of a selected wavelength. It is possible thereby to ascertain changes in the optical path section, for example as a result of thermally caused length changes. In addition, as described, there is also the possibility of detecting wavelength drift. For detecting wavelength drift of a used optical light source, it is here additionally or alternatively possible to use a wavelength sensor, for example a resonator ring or a directional coupler.

With respect to the expansion sensor, the measurement principle according to the Michelson interferometer is preferred, since here the evaluation of a simple intensity modulation is sufficient, which is of simpler configuration in the case of the Bragg sensor as compared to an otherwise necessary spectrometer.

The following is a summary list of reference numerals and the corresponding structure used in the above description of the invention:

2 sensor unit
4 evaluation unit
6,6A,6B,6C,6D optical fibers
8 sensor element
10,10A,10B,10C,10D coupling sites
12 substrate
14A,14B,14C,14D optical sensors
16A,16B,16C,16D measurement waveguide
18 central cutout
20 branching
21A, 21B waveguide arm
22 end face
24 mirror
26 lambda quarter element
28 notch
30 crystal
32 Bragg grating
34 GRIN lens
A response signal
S sensor signal

The invention claimed is:

1. A sensor unit, comprising:
a sensor element having a substrate and a plurality of integrated optical components embedded in said substrate, said plurality of integrated optical components being modified portions of said substrate;
said plurality of integrated optical components including at least one integrated measurement waveguide forming an integrated optical sensor for measuring an electric variable and at least one further integrated optical component embedded in said substrate and forming a further integrated optical sensor;
said optical sensors being selected from the group consisting of:
a) an optical current sensor based on the Faraday effect for measuring an electric current in a current-carrying conductor;
b) an optical voltage sensor based on the Pockels effect for measuring an electric voltage;
c) an optical expansion sensor for measuring an expansion; and
d) a wavelength sensor for measuring a change in an optical wavelength.

2. The sensor unit according to claim 1, which further comprises a common evaluation unit for evaluating response signals of said optical sensors, said evaluation unit being configured to evaluate optical response signals of said voltage sensor and/or of said current sensor with incorporation of optical response signals of said expansion sensor and/or of said wavelength sensor.

3. The sensor unit according to claim 1, wherein one of said measurement waveguides is concurrently used for a plurality of different sensors.

4. The sensor unit according to claim 1, wherein said optical expansion sensor forms a Michelson interferometer having two waveguide arms, which are embedded in said substrate and having different optical path lengths.

5. The sensor unit according to claim 1, wherein said two waveguide arms of said optical expansion sensor extend in a shape of circular rings concentrically to each other and have different radii of curvature defining the different optical path lengths.

6. The sensor unit according to claim 5, wherein one of said waveguide arms is formed at the same time by a measurement waveguide for a different sensor.

7. The sensor unit according to claim 1, wherein said wavelength sensor has one or more of the following: a Bragg grating, a resonator ring, or a directional coupler.

8. The sensor unit according to claim 1, wherein said optical components are integrated on a common substrate in the form of a wafer, and wherein said substrate is a circular ring segment that extends at least over 180° about a circular cutout from a first end face to a second end face.

9. The sensor unit according to claim 1, wherein said substrate has a coupling site, at least two optical fibers, and coupling elements, that connect said at least two optical fibers to said coupling site of said substrate, wherein each of said at least two optical fibers is allocated to each said optical sensor for coupling a sensor signal into said substrate and/or for coupling a response signal out of said substrate.

10. The sensor unit according to claim 1, wherein said substrate is a non-birefringent substrate configured to produce targeted birefringence in a partial region thereof for forming an integrated optical component having birefringent function.

11. The sensor unit according to claim 10, wherein said substrate is configured to form an integrated lambda quarter element.

12. The sensor unit according to claim 10, wherein said integrated optical components are formed in said substrate using an ion diffusion process, and wherein said substrate is glass.

13. The sensor unit according to claim 1, wherein said integrated optical components are selected from the group consisting of optical waveguides in straight or curved shape, polarization-changing optical components, lambda quarter elements, coupling sites for coupling light in and out, reflective surfaces and end faces, and optical gratings.

14. The sensor unit according to claim 1, wherein said optical voltage sensor has a coupling site for a polarization-maintaining fiber that is coupled to said substrate, an integrated optical lambda quarter element, and a measurement waveguide, which is integrated in a birefringent substrate suitable for the Pockels effect.

15. The sensor unit according to claim 1, wherein said optical voltage sensor has a coupling site for a polarization-maintaining fiber that is coupled to said substrate, an integrated optical lambda quarter element, and a combination of an optical lens and a birefringent substrate suitable for the Pockels effect.

16. The sensor unit according to claim 15, wherein said birefringent substrate is a birefringent crystal selected from the group consisting of a lithium niobate crystal, ammonium dihydrogen phosphate, and potassium dihydrogen phosphate.

17. The sensor unit according to claim 1, wherein said current sensor has a coupling site for a polarization-maintaining fiber that is coupled to said substrate, an optical lambda quarter element, and a curved waveguide forming the measurement waveguide.

18. The sensor unit according to claim 1, wherein said expansion sensor has a coupling site for a single-mode optical fiber that is coupled to said substrate, and an integrated optical waveguide, in which a surface grating having a suitable grating period is introduced.

19. The sensor unit according to claim 18, wherein a temperature-related variation of said surface grating is used for temperature measurement.

20. The sensor unit according to claim 1, configured for current or voltage measurement in a medium voltage installation.

21. The sensor unit according to claim 1, wherein:

said substrate is shaped as a circular ring segment which extends at least over 180° about a circular cutout from a first end face to a second end face, said substrate has at least two embedded waveguides;

said first end face defines a coupling site;

at least two optical fibers are connected to said coupling site of said substrate by way of coupling elements for coupling a sensor signal into said waveguides and/or for coupling a response signal out of said waveguides; and said second end face is prepared for forming a mirror at an end of at least one of said waveguides.

* * * * *